US012716126B2

(12) United States Patent
Kachel

(10) Patent No.: US 12,716,126 B2
(45) Date of Patent: Aug. 25, 2026

(54) SELECTIVE DEPOSITION

(71) Applicant: ASM IP Holding B.V., Almere (NL)

(72) Inventor: Krzysztof Kamil Kachel, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 52 days.

(21) Appl. No.: 18/895,683

(22) Filed: Sep. 25, 2024

(65) Prior Publication Data

US 2025/0109490 A1 Apr. 3, 2025

Related U.S. Application Data

(60) Provisional application No. 63/541,607, filed on Sep. 29, 2023.

(51) Int. Cl.

*C23C 16/34* (2006.01)
*C23C 16/04* (2006.01)
*C23C 16/455* (2006.01)
*C23C 16/56* (2006.01)

(52) U.S. Cl.

CPC ............ *C23C 16/042* (2013.01); *C23C 16/34* (2013.01); *C23C 16/45553* (2013.01); *C23C 16/56* (2013.01)

(58) Field of Classification Search

CPC . C23C 16/042; C23C 16/34; C23C 16/45553; C23C 16/56

See application file for complete search history.

(56) References Cited

U.S. PATENT DOCUMENTS 10,118,828 B2 11/2018 Shero
10,354,887 B2 7/2019 Fischer
10,373,906 B2 8/2019 Lin
10,553,482 B2 2/2020 Wang
(Continued)

FOREIGN PATENT DOCUMENTS

CN 107342312 B 2/2020
JP 2008-34555 * 2/2008 ............... H05K 3/06
(Continued)

OTHER PUBLICATIONS

Van der Wel, Bernhard, et al., "Area-Selective Low-Pressure Thermal Atomic Layer Deposition of Aluminum Nitride". J. Phys. Chem. C2023, 127, 17134-17145.*

(Continued)

*Primary Examiner* — Bret P Chen
(74) *Attorney, Agent, or Firm* — Snell & Wilmer L.L.P.

(57) ABSTRACT

A method, system and apparatus for selectively forming aluminum oxide on a first surface of a substrate relative to a second different surface of the substrate, the process comprising one or more super-cycles comprising sub-cycles: a) selectively depositing aluminum nitride on the first surface of the substrate relative to the second different surface of the substrate by one or more selective deposition sub-cycles, b) oxidizing at least a portion of the aluminum nitride by one or more oxidizing sub-cycles, c) etching the aluminum oxide or aluminum nitride, or a combination thereof by one or more thermal etching sub-cycles wherein the etchant is an organic halide, and repeating sub-cycles a), b) or c), or a combination thereof until a desired thickness of an aluminum oxide is formed on the first surface.

19 Claims, 6 Drawing Sheets

(56) References Cited

U.S. PATENT DOCUMENTS

| | | | | |
|---|---|---|---|---|
| 10,566,185 | B2 * | 2/2020 | Wang | H10P 14/6514 |
| 10,651,080 | B2 * | 5/2020 | Rainville | H10W 20/077 |
| 11,139,163 | B2 | 10/2021 | Maes | |
| 11,170,993 | B2 | 11/2021 | Tois | |
| 11,174,550 | B2 | 11/2021 | Haukka | |
| 11,276,572 | B2 | 3/2022 | Wada | |
| 11,387,107 | B2 | 7/2022 | Tois | |
| 11,430,656 | B2 | 8/2022 | Haukka | |
| 11,446,699 | B2 | 9/2022 | Pore | |
| 11,501,965 | B2 | 11/2022 | Jia | |
| 11,728,175 | B2 | 8/2023 | Tois | |
| 2008/0242097 | A1 * | 10/2008 | Boescke | H10D 1/665 257/E21.279 |
| 2011/0059600 | A1 * | 3/2011 | Sakai | H01L 21/67028 438/584 |
| 2013/0037897 | A1 * | 2/2013 | Sun | H10N 52/01 257/E29.323 |
| 2017/0154806 | A1 * | 6/2017 | Wang | H10P 14/69391 |
| 2018/0069112 | A1 * | 3/2018 | Inumiya | H10D 30/015 |
| 2019/0341256 | A1 * | 11/2019 | Shankar | H10P 50/73 |
| 2022/0235461 | A1 | 7/2022 | Kim | |
| 2023/0038952 | A1 * | 2/2023 | Lin | H01L 21/76289 |

FOREIGN PATENT DOCUMENTS

| | | | | |
|---|---|---|---|---|
| JP | 2011-79698 | * | 4/2011 | C30B 29/38 |
| JP | 2021-528867 | * | 10/2021 | H01L 21/306 |
| TW | 201718923 A | * | 6/2017 | C23C 16/34 |

OTHER PUBLICATIONS

Yu, Jun Ho, et al., "Area-selective atomic layer deposition of Al203 using inkjet-printed inhibition patterns and lift-off process". Journal of Information Display, 2023, vol. 24, No. 3, 215-225.*

Blad, Marianne, "Oxidation of Aluminum Nitride at High Temperature and Low Pressure". Calphad, vol. 20, No. 2, pp. 161-170, 1996.*

Chou, Chun-Yi, et al., "Atomic Layer Nucleation Engineering: Inhibitor-Free Area-Selective Atomic Layer Deposition of Oxide and Nitride". Chemistry of Materials, 2021, 33, 5584-5590.*

Labatut, C., et al., "An in-situ study of the oxidation of AIN layers fabricated by LPCVD using X-ray diffraction". Journal of the European Ceramic Society, vol. 13, Issue 4, 1994, pp. 339-344. Abstract Only.*

* cited by examiner

SELECTIVE DEPOSITION

CROSS-REFERENCE TO RELATED APPLICATIONS

This application is a nonprovisional of, and claims priority to and the benefit of, U.S. Provisional Patent Application No. 63/541,607, filed Sep. 29, 2023 and entitled "SELECTIVE DEPOSITION," which is hereby incorporated by reference herein.

FIELD OF THE DISCLOSURE

The present application relates to selective deposition of aluminum, nitrogen and/or oxygen containing material, for example an Al and N and/or Al and O containing thin film on a first surface of a substrate relative to a second surface.

BACKGROUND OF THE DISCLOSURE

Integrated circuits are currently manufactured by an elaborate process in which various layers of materials are sequentially constructed in a predetermined arrangement on a semiconductor substrate.

The predetermined arrangement of materials on a semiconductor substrate is often accomplished by deposition of a material over the entire substrate surface, followed by removal of the material from predetermined areas of the substrate, such as by deposition of a mask layer and subsequent selective etching process.

In certain cases, the number of steps involved in manufacturing an integrated surface on a substrate may be reduced by utilizing a selective deposition process, wherein a material is selectively deposited on a first surface relative to a second surface without the need, or with reduced need for subsequent processing. Methods are disclosed herein for selective deposition on a first surface of substrate relative to a second, different surface of the substrate.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to necessarily identify key features or essential features of the claimed subject matter, nor is it intended to be used to limit the scope of the claimed subject matter.

Disclosed herein are processes, systems and apparatus for selectively forming aluminum oxide on a first surface of a substrate relative to a second different surface of the substrate, wherein examples may comprise one or more super-cycles comprising sub-cycles: a) selectively depositing aluminum nitride on the first surface of the substrate relative to the second different surface of the substrate by one or more selective deposition sub-cycles, b) oxidizing at least a portion of the aluminum nitride by one or more oxidizing sub-cycles, c) etching the aluminum oxide or aluminum nitride, or a combination thereof by one or more thermal etching sub-cycles wherein the etchant is an organic halide and wherein the sub-cycles a), b) or c), or a combination thereof may be repeated until a desired thickness of an aluminum oxide is formed on the first surface.

In certain examples, the aluminum oxide may be selectively formed on the first surface of the substrate relative to the second different surface of the substrate.

In some examples, the one or more super-cycles additionally may comprise exposing the substrate to a pretreatment reactant.

In various examples, the substrate may be exposed to a pretreatment reactant prior to the one or more selective deposition sub-cycles.

In particular examples, the pretreatment reactant may comprises plasma.

In certain examples, the plasma may be generated from a gas comprising H2.

In certain examples, the one or more selective deposition sub-cycles may comprise: contacting the substrate with a first vapor phase precursor comprising aluminum; and contacting the substrate with a second vapor phase precursor comprising nitrogen.

In particular examples, the first vapor phase precursor comprising aluminum may comprise tritertbutylaluminum (TTBA), trimethylaluminum (TMA) or triethylaluminum (TEA).

In various examples, the second vapor phase precursor comprising nitrogen may comprise NH3.

In certain examples, the one or more oxidizing sub-cycles may comprise: contacting the substrate with a first vapor phase precursor comprising oxygen.

In some examples, the first vapor phase precursor comprising oxygen may comprise O3, H2O, H2O2, O2, oxygen atoms, oxygen plasma, native oxide, exposure to ambient or oxygen radicals, or mixtures thereof.

In particular examples, the one or more thermal etching sub-cycles may comprise: contacting the substrate with a first vapor phase halide etch reactant and contacting the substrate with a second vapor phase etch reactant comprising aluminum.

In some examples, the first vapor phase halide etch reactant may comprise HF, CCl4, BCl3, CF4, hacac, NF3, hexafluoroacetylacetone (hhfac), trifluroacetylacetonate, NF3 or NbF5, or a combination thereof.

In certain examples, the second vapor phase etch reactant comprising aluminum may comprise trimethylaluminum (TMA) or triethylaluminum (TEA).

In certain embodiments, the one or more thermal etching sub-cycles may be carried out at a process temperature of about 25° C.-500° C.

In various embodiments, the first surface may be a conductive surface and the second different surface may be a dielectric surface.

In particular embodiments, the first surface may comprise W, Co, Ru, TiN, Cu, Mo, MoN, TaN, or Ta, or a combination thereof.

In some embodiments, the second surface may comprise SiO2, SiN, SiGe, SiOxC, SiOxN, HfOx, ZrOx, HfSiOx, SiOxCyNz or ZrSiOx, or a combination thereof, where x=0-2, y=0-2 and z=0-2.

In various embodiments, the one or more selective deposition sub-cycles may be repeated from 1 to about 1000 times and the one or more thermal etching sub-cycles may be repeated from 1 to about 1000 times.

In particular examples, the one or more thermal etching sub-cycles may comprise contacting the substrate with a first vapor phase halide etch reactant comprising hhfac, and a second vapor phase etch reactant comprising trimethylaluminium (TMA).

For the purpose of summarizing the disclosure and the advantages achieved over the prior art, certain objects and advantages of the disclosure have been described herein above. Of course, it is to be understood that not necessarily all such objects or advantages can be achieved in accordance with any particular embodiment or example of the disclosure. Thus, for example, those skilled in the art will recognize that the examples disclosed herein can be carried out in a manner that achieves or optimizes one advantage or group of advantages as taught or suggested herein without necessarily achieving other objects or advantages as can be taught or suggested herein.

All of these examples are intended to be within the scope of the disclosure. These and other embodiments will become readily apparent to those skilled in the art from the following detailed description of certain examples having reference to the attached figures, the disclosure not being limited to any particular example(s) discussed.

BRIEF DESCRIPTION OF THE DRAWING FIGURES

While the specification concludes with claims particularly pointing out and distinctly claiming what are regarded as embodiments or examples of the disclosure, the advantages of examples of the disclosure may be more readily ascertained from the description of certain examples of the disclosure when read in conjunction with the accompanying drawings. Elements with the like element numbering throughout the figures are intended to be the same.

Figure 3A:
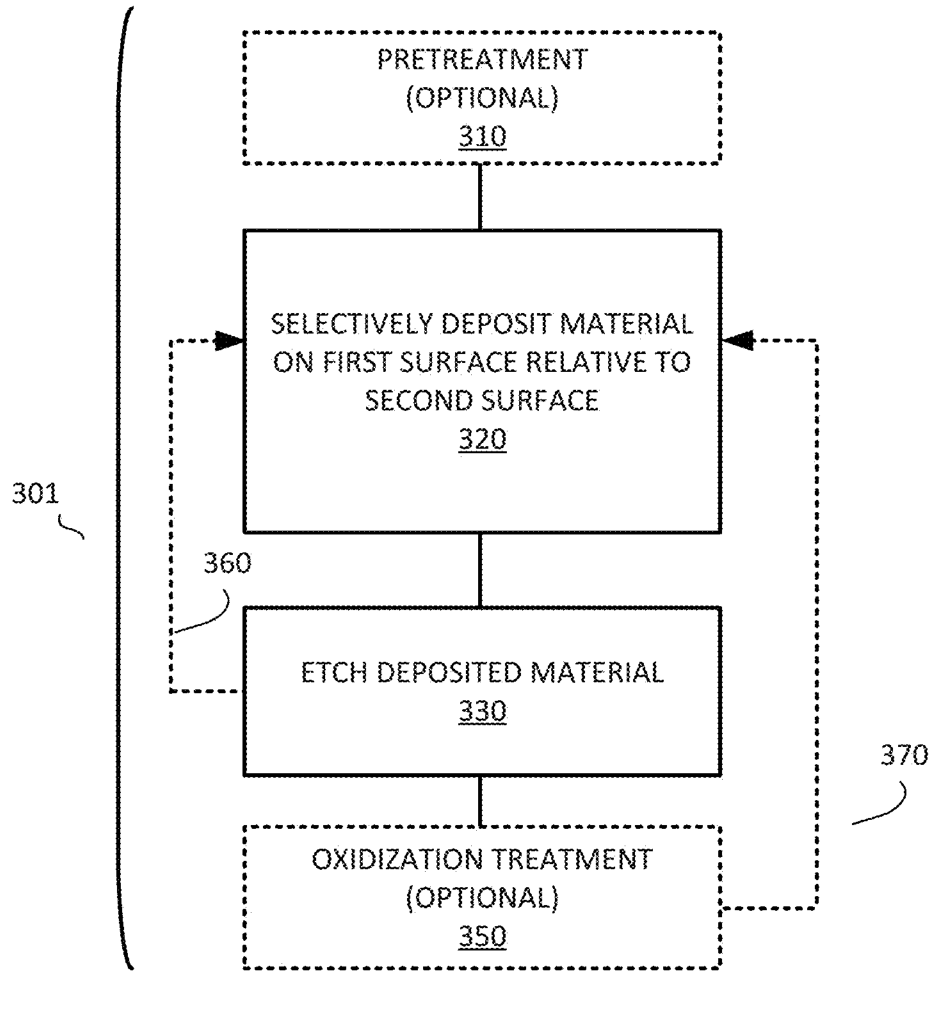
Figure 3B:
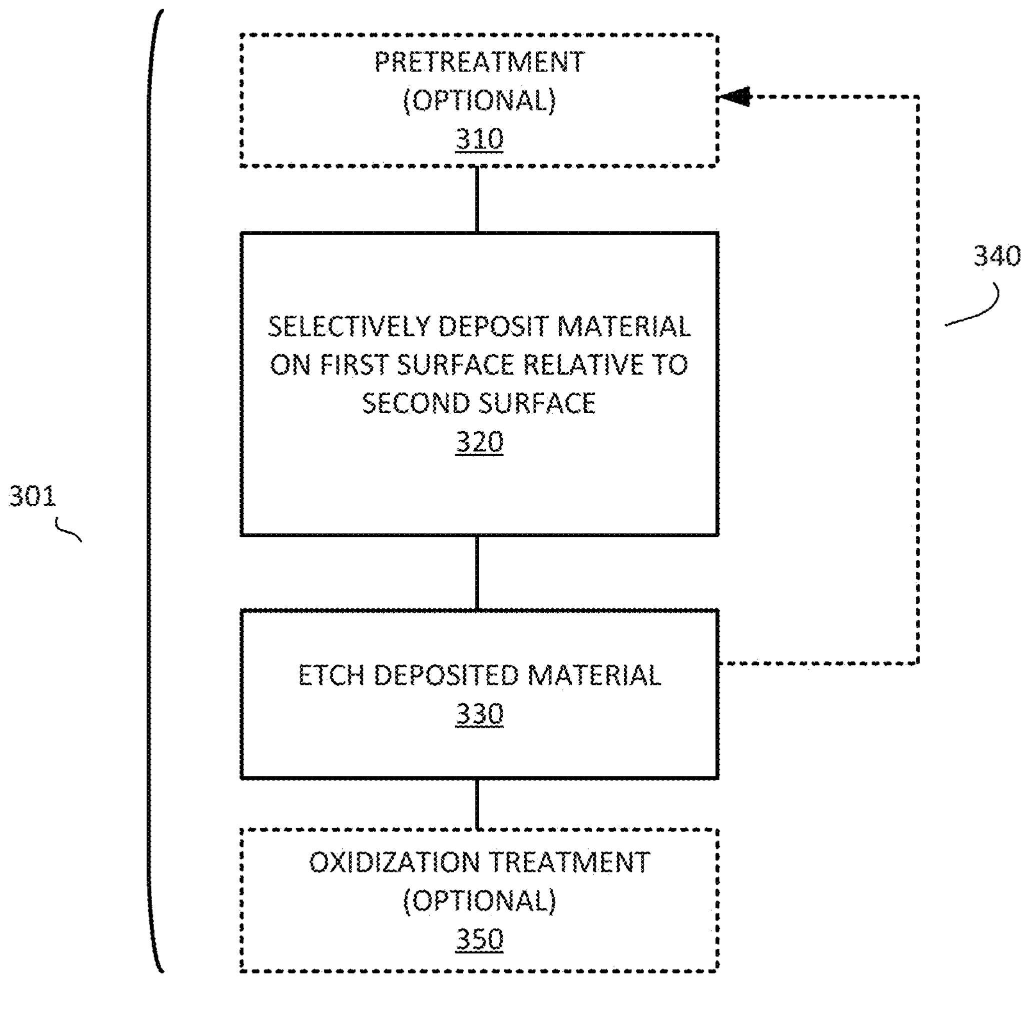
Figure 3C:
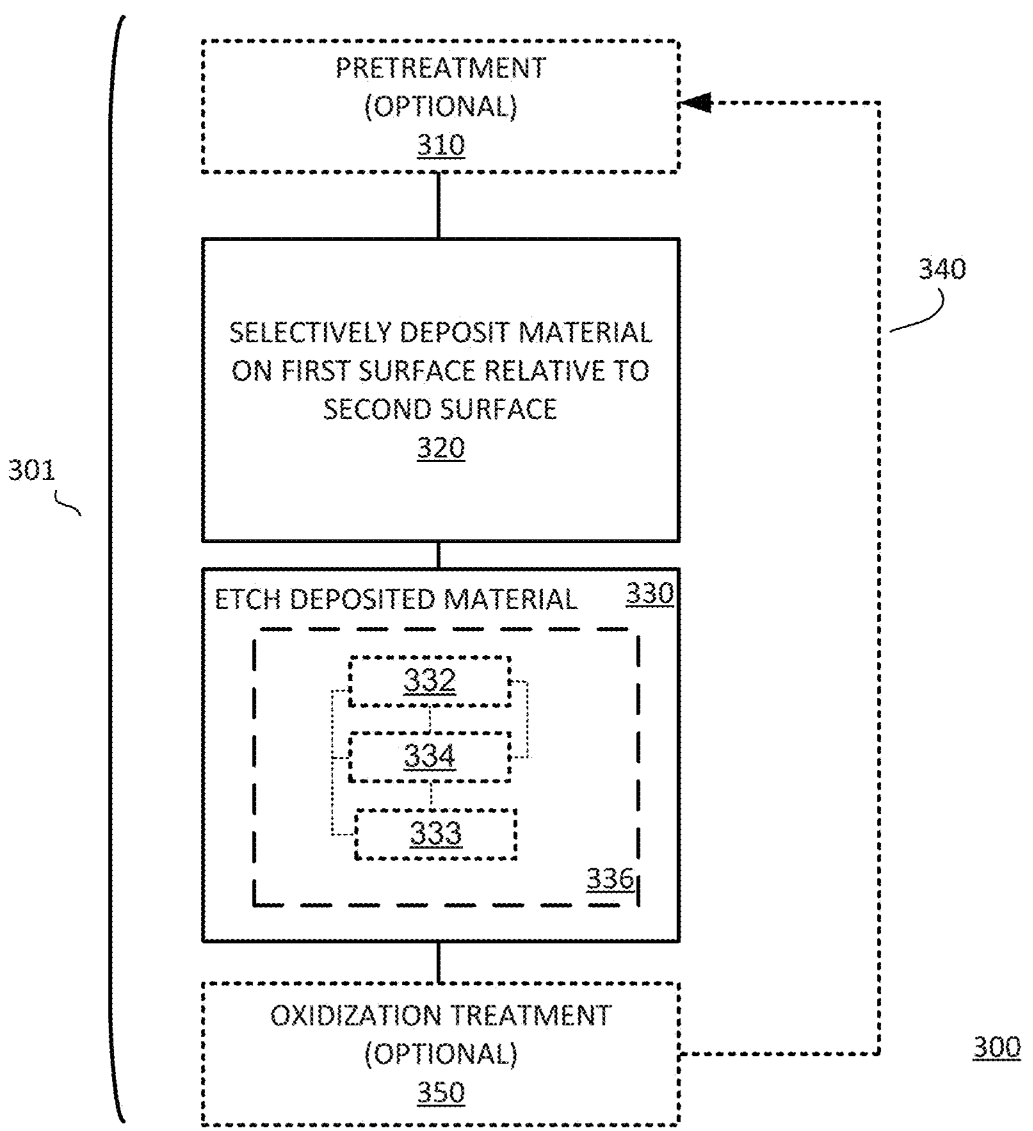
Figure 4:
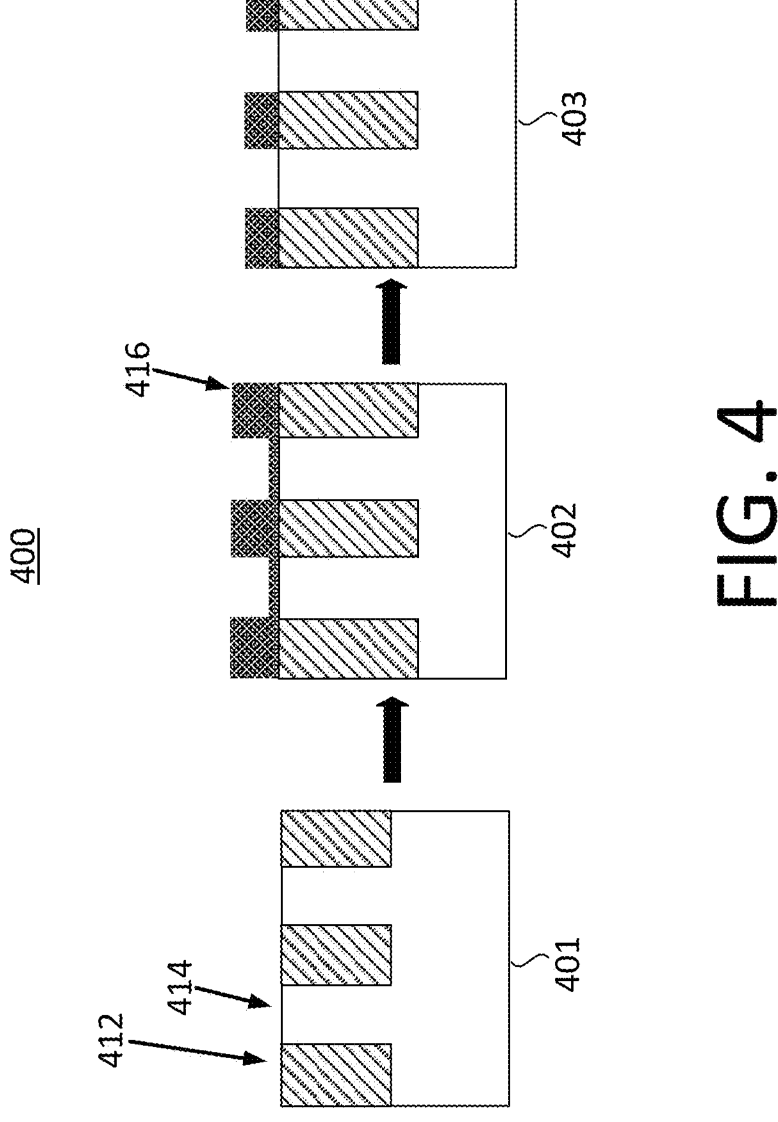

FIGS. 3A-3C illustrate a deposition process flow for selectively depositing an Al and N and/or O containing material on a first surface of a substrate relative to a second, different surface of the same substrate including a selective deposition sub-cycle and an atomic layer etching sub-cycle; and FIG. 4 illustrates a deposition process flow for selectively depositing an Al and N and/or O containing material on a first surface of a substrate relative to a second, different surface of the same substrate.

DETAILED DESCRIPTION

The detailed description of various examples herein makes reference to the accompanying drawings, which show the exemplary examples by way of illustration. While these exemplary examples are described in sufficient detail to enable those skilled in the art to practice the disclosure, it should be understood that other examples may be realized and that logical, chemical, and/or mechanical changes may be made without departing from the spirit and scope of the disclosure. Thus, the detailed description herein is presented for purposes of illustration only and not of limitation. For example, the steps recited in any of the method or process descriptions can be executed in any combination and/or order and are not limited to the combination and/or order presented. Further, one or more steps from one of the disclosed methods or processes can be combined with one or more steps from another of the disclosed methods or processes in any suitable combination and/or order. Moreover, any of the functions or steps can be outsourced to or performed by one or more third parties. Furthermore, any reference to singular includes plural examples, and any reference to more than one component can include a singular example.

Although certain embodiments and examples are disclosed below, it will be understood by those in the art that the disclosure extends beyond the specifically disclosed examples and/or uses of the disclosure and obvious modifications and equivalents thereof. Thus, it is intended that the scope of the disclosure should not be limited by the particular examples described herein.

The illustrations presented herein are not meant to be actual views of any particular material, apparatus, structure, or device, but are merely representations that are used to describe examples of the disclosure.

As used herein, the term "substrate" can refer to any underlying material or materials that may be used, or upon which, a device, a circuit, or a film/layer may be formed.

As used herein, the term "atomic layer deposition" (ALD) can refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) can subsequently be introduced into the process chamber for use in converting the chemisorbed precursor to the desired material on the deposition surface. Typically, this reactant is capable of further reaction with the precursor. Further, purging steps can also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) can refer to any process wherein a substrate is exposed to one or more volatile precursors, which react and/or decompose on a substrate surface to produce a desired deposition.

As used herein, the terms "layer," "film," and/or "thin film" can refer to any continuous or non-continuous structures and material deposited by the methods disclosed herein. For example, "layer," "film," and/or "thin film" could include 2D materials, nanorods, nanotubes, or nanoparticles or even partial or full molecular layers or partial or full atomic layers or clusters of atoms and/or molecules. "Layer," "film," and/or "thin film" can comprise material or a layer with pinholes, but still be at least partially continuous.

Further, in this disclosure, any two numbers of a variable can constitute a workable range of the variable, and any ranges indicated can include or exclude the endpoints. Additionally, any values of variables indicated (regardless of whether they are indicated with "about" or not) can refer to precise values or approximate values and include equivalents, and can refer to average, median, representative, majority, or the like. Further, in this disclosure, the terms "including," "constituted by" and "having" can refer independently to "typically or broadly comprising," "comprising," "consisting essentially of," or "consisting of" in some examples. In this disclosure, any defined meanings do not necessarily exclude ordinary and customary meanings in some examples.

Figure 1:
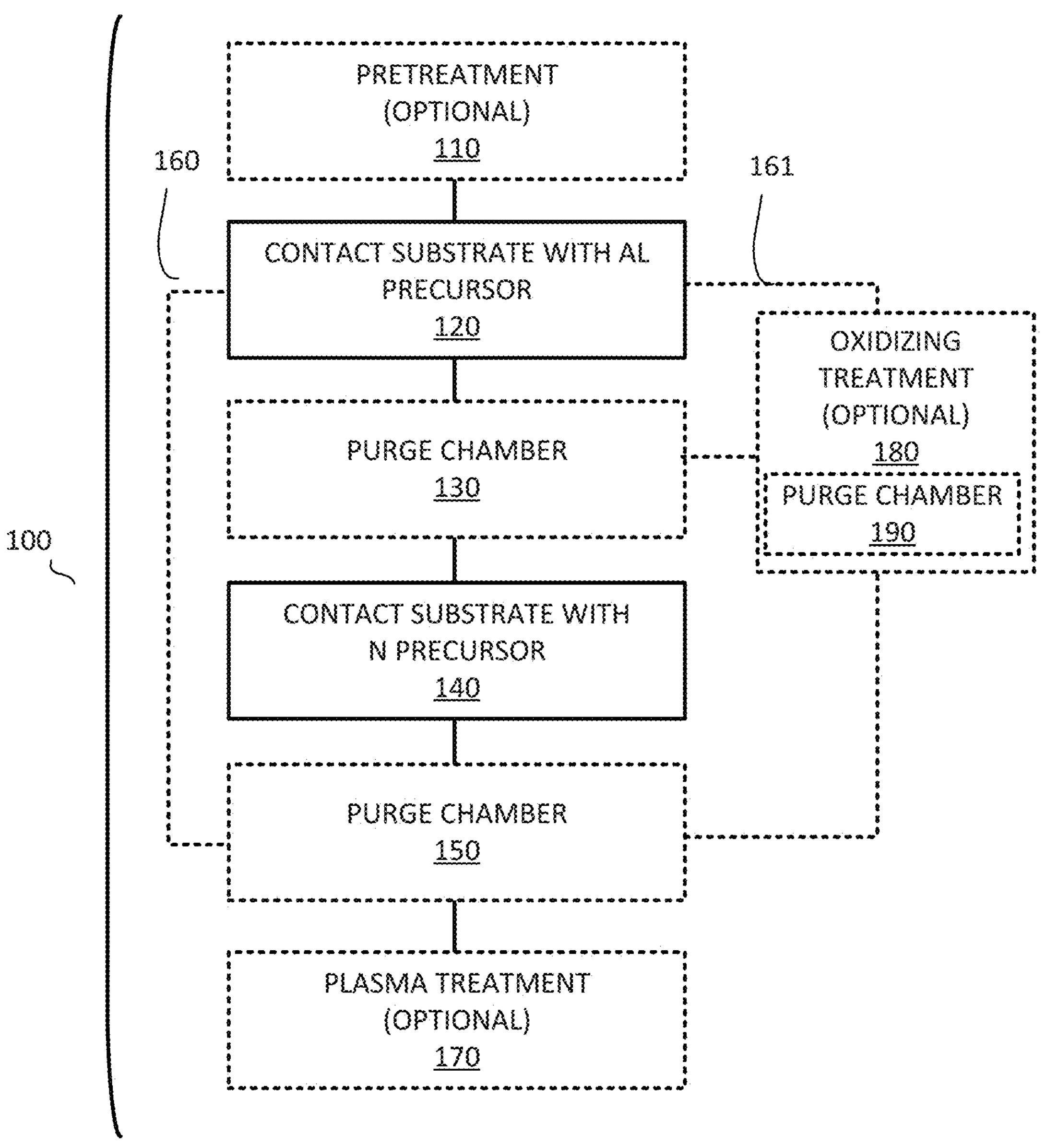
FIG. 1 illustrates a deposition process flow for selectively depositing an Al and N and/or O containing material on a first surface of a substrate relative to a second, different surface of the same substrate.

Referring to FIG. 1 an Al and N and/or O containing material may be selectively deposited on a first surface of a substrate comprising a first surface and a second, different surface by an ALD type deposition process 100 comprising at least one cycle comprising, contacting the substrate with a first vapor phase precursor comprising Al at step 120; removing excess first precursor and reaction by products, if any, from the substrate at step 130; contacting the substrate with a second vapor phase precursor comprising nitrogen at step 140; removing from the substrate, at step 150, excess second precursor and any gaseous by-products, and; optionally repeating at step 160 the contacting and removing steps until an Al and N and/or O containing material of the desired thickness has been formed. In some examples, an Al and N and/or O containing material may comprise AlN, non-stoichiometric aluminum oxide, $Al_2O_3$, and/or aluminum oxynitride (ALON), for example.

In some examples, one or more surfaces of the substrate may be subjected to a pretreatment process 110 prior to beginning the deposition process 100. A pretreatment process may enhance the selectivity of the selective deposition process 100. In some embodiments, a pretreatment process may enhance deposition of an Al and N and/or O containing material on one surface relative to one or more different surfaces prior to beginning the deposition process 100. In an example, a pretreatment process may inhibit deposition of an Al and N and/or O containing material on one surface relative to one or more different surface prior to beginning the deposition process 100.

In FIG. 1 this is indicated by step 110 in which the substrate can be exposed to a pretreatment reactant, for example a plasma, prior to deposition of an Al and N and/or O containing material. In some examples, a pretreatment reactant may comprise oxygen, oxygen radicals, atomic oxygen, oxygen plasma, or combinations thereof. In some examples, a pretreatment reactant may comprise nitrogen, nitrogen radicals, atomic nitrogen, nitrogen plasma, or combinations thereof. In an example, a pretreatment reactant may comprise hydrogen, hydrogen radicals, atomic hydrogen, hydrogen plasma, or combinations thereof.

In some embodiments utilizing a pretreatment process wherein the substrate is exposed to a pretreatment reactant comprising oxygen plasma, $O_2$ may be provided, for example, from about 1 to about 2000 sccm, more preferably from about 5 to about 1000 sccm, and most preferably from about 50 to about 500 sccm. In an example, $O_2$ may be provided at about 300 sccm. In some examples, utilizing a pretreatment process wherein the substrate is exposed to a pretreatment reactant comprising nitrogen plasma, $N_2$ may be provided, for example, at from about 1 to about 5000 sccm, more preferably from about 5 to about 2000 sccm, and most preferably from about 50 to about 500 sccm. In an example, $N_2$ may be provided at about 300 sccm. In some embodiments a pretreatment process wherein the substrate is exposed to a pretreatment reactant comprising hydrogen plasma, $H_2$ may be provided, for example, from about 1 to about 2000 sccm, more preferably from about 5 to about 1000 sccm, and most preferably from about 10 to about 100 sccm. In an example, $H_2$ may be provided at about 50 sccm. Similar conditions can be used for other types of plasma.

In some examples, a pretreatment process may comprise exposing the substrate to a pretreatment reactant at a pretreatment temperature. In an example, the pretreatment temperature may be greater than about 20° C. In some embodiments a pretreatment temperature may be between about 20° C. and about 500° C., more preferably between about 50° C. and about 450° C., more preferably between about 150° C. and about 400° C. In an example, the pretreatment temperature may be about the same as the deposition temperature. In some examples, the pretreatment temperature may be different than the deposition temperature. In an example, plasma may be generated at a power of less than about 2500 Watts, for example about 1 to about 1000 Watts, about 1 to about 500 W, or about 1 to about 200 W or less. In some embodiments plasma may be generated at a power of 50 W. In an example, plasma may be generated at a power of 100 W.

In some examples, the plasma is provided for less than about 200 seconds, for example about 180 seconds or less, about 60 seconds or less, about 30 seconds or less, about 10 seconds or less, or about 3 seconds or less.

In some embodiments, plasma is formed in a reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of remote plasma, the pathway to the substrate can be optimized to maximize electrically neutral species and minimize ion survival before reaching the substrate.

In an example, the treated substrate is not exposed to the ambient environment after a pretreatment process and before beginning a selective deposition process. In some embodiments the treated substrate is not exposed to air after a pretreatment process and before beginning a selective deposition process.

In an example, a pretreatment process may be used to enhance the selectivity of the subsequent selective deposition process. In some examples, a pretreatment process may enhance selective deposition of an Al and N and/or O containing material on a first surface relative to a second different surface. In an example, a pretreatment process may enhance the selectivity of a subsequent selective deposition process by a factor of more than about 2, more than about 5, or more than about 10.

In some embodiments a pretreatment process may be performed in the same reaction chamber or reactor as the subsequent deposition process 100. In an example, a pretreatment process may be performed in a different reaction chamber or reactor than the subsequent deposition process 100.

Referring still to FIG. 1, the substrate is contacted with a first precursor comprising Al at step 120. In some examples, the first precursor is conducted into a reaction chamber in the form of vapor phase pulse and contacted with the surface of the substrate. Conditions are preferably selected such that no more than about one monolayer of the precursor is adsorbed on the substrate surface in a self-limiting manner. However, in some embodiments conditions may be selected such that more than one monolayer of the precursor may be formed.

The first precursor pulse is preferably supplied in gaseous form. The first precursor gas is considered "volatile" for purposes of the present description if the species exhibits sufficient vapor pressure under the process conditions to transport the species to the workpiece in sufficient concentration to saturate exposed surfaces.

In an example, the first precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second.

The first precursor employed in the ALD type processes may be solid, liquid, or gaseous material under standard conditions (room temperature and atmospheric pressure), provided that the first precursor is in vapor phase before it is conducted into the reaction chamber and contacted with the substrate surface.

At step 130 an optional purge operation may be implemented to remove excess first precursor and reaction byproducts, if any, from the substrate surface, for example by purging with a pulse of inert gas such as nitrogen or argon. Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10 seconds, and still more preferably between about 1 and 2 seconds. However, other purge times can be utilized if necessary, such as when depositing layers over extremely high aspect ratio structures or other structures with complex surface morphology is needed. The appropriate purging times can be readily determined by the skilled artisan based on the particular circumstances.

In other embodiments however, removing excess first precursor and reaction byproducts, if any, may comprise moving the substrate so that the first precursor no longer contacts the substrate. In some embodiments no precursor may be removed from the various parts of a chamber. In an example, the substrate is moved from a part of the chamber containing a first precursor to another part of the chamber containing a second precursor or no precursor at all. In some examples, the substrate is moved from a first reaction chamber to a second, different reaction chamber.

At step 140 the substrate is contacted with a second vapor phase precursor comprising N. In an example, the second precursor is pulsed into the chamber where it reacts with the first precursor bound to the first surface of the substrate. The reaction typically forms up to about a monolayer of an Al and N and/or O containing material on the substrate. In some embodiments, however, more than one molecular layer of an Al and N and/or O containing material is formed on the substrate.

In some embodiments, the second precursor may include nitrogen plasma or nitrogen radicals. In such embodiments, nitrogen may be energized within the reaction chamber or upstream of the reaction chamber. Where a plasma is desired, the flow of un-energized second precursor may comprise a type of purge gas, such that after the substrate has been exposed to a nitrogen plasma for a desired period of time, the plasma generator may be turned off and the flow of nitrogen precursor itself is used to clear the reaction chamber of excess nitrogen plasma and unreacted byproducts.

While one skilled in the art will recognize that any number of suitable second precursors may be used, appropriate second precursors include nitrogen containing compounds that favorably react with the ligands of a previously or subsequently deposited first precursor. Accordingly, selection of an appropriate second precursor may depend on the specific first precursor used and the nature of the ligands in the first precursor In some embodiments the second precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second. However, depending on the reactor type, substrate type and its surface area, the second precursor contacting time may be even higher than 10 seconds. In some embodiments, contacting times can be on the order of minutes. The optimum contacting time can be readily determined by the skilled artisan based on the particular circumstances.

The concentration of the second precursor in the reaction chamber may be from about 0.01% by volume to about 99.0% by volume. And the second precursor may flow through the reaction chamber at a rate of between about 1 standard cm3/min and about 4000 standard cm3/min.

At step 150, an optional purge operation may be implemented to remove excess second precursor and gaseous by-products of the surface reaction, if any, from the substrate, as described above for step 130. In an example, excess precursor and reaction byproducts are preferably removed with the aid of an inert gas.

The steps of contacting and removing may be optionally repeated at step 160 until an Al and N containing material of a desired thickness has been formed on the first surface of the substrate, with each cycle leaving no more than about a molecular monolayer. In an example, step 160 may be repeated from about 1 to about 1000 times, or any appropriate number of cycles. In some cases, it might be desirable to achieve at least partial decomposition of at least one of the various precursors. Thus, in some embodiments conditions may be selected such that more than one molecular layer of an Al and N containing material is formed on the substrate in each deposition cycle.

At step 180, deposited AlN may be exposed to an optional oxidizing sub-cycle (e.g., "oxidation treatment"). Such oxidizing sub-cycle may comprise contacting the AlN on the substrate with an oxidizer comprising a vapor phase precursor comprising oxygen, wherein the vapor phase precursor comprising oxygen comprises, for example, O3, H2O, H2O2, O2, oxygen atoms, oxygen plasma, native oxide, exposure to ambient (e.g., includes oxygen and moisture in atmosphere) or oxygen radicals, or mixtures thereof to oxidize AlN to aluminum oxide.

In certain embodiments, oxidation treatment of oxidizing sub-cycle at step 180 may comprise exposing the substrate to oxygen or an oxygen-containing precursor provided in the reaction chamber and allowed to contact the substrate surface. The oxygen treatment phase may be part of one or more deposition cycles or may be its own sub-cycle 161. The oxygen treatment sub-cycle 161 may be entered after any appropriate step of process 100. In some examples, a second metal phase may be provided in one or more deposition cycles. The oxidation phase, or other desirable phase, may follow the Al phase or the N phase, but in either case, it may be desirable in some embodiments, to remove excess oxygen (or other reactant) and any reaction by-products from the reaction space (purge step 190) before proceeding to the next phase. In an example, an additional phase, such as an oxygen, or additional metal phase may be provided after the final deposition cycle, or intermittently in the deposition process.

In some embodiments oxidation treatment may be performed before the deposited Al and N and/or O containing material film is continuous or closed. In an example, oxidation treatment may be performed after about every 2 deposition cycles, after about every 4 deposition cycles, after about every 6 deposition cycles, after about every 10 deposition cycles, 25 deposition cycles, after about every 50 deposition cycles, after about every 100 deposition cycles, after about every 200 deposition cycles, after about every 300 deposition cycles, after about every 400 deposition cycles, after about every 500 deposition cycles, after about every 1000 deposition cycles, or any other suitable number of deposition cycles.

The Al and N and/or O containing material ALD process 100 of the present disclosure may comprise one or more cycles. Some embodiments involve the repetition of at least about 2 cycles, or about 4 cycles, or about 8 cycles, or about 10 cycles, about 20 cycles, or about 50 cycles, about 100 cycles, or about 200 cycles, or about 300 cycles, or about 400 cycles, about 500 cycles, or about 1000 cycles, any other suitable number of cycles.

In some examples, the substrate surface and/or Al and N and/or O containing material may optionally be subjected to a plasma treatment process. In FIG. 1 this is indicated by step 170. In an example, the plasma treatment process may be performed after more than one deposition cycle has been performed. In some embodiments a plasma treatment process may be performed before the deposited Al and N and/or O containing material film is continuous or closed. In an example, a plasma treatment process may be performed after about every 2 deposition cycles, after about every 4 deposition cycles, after about every 6 deposition cycles, after about every 10 deposition cycles, 25 deposition cycles, after about every 50 deposition cycles, after about every 100 deposition cycles, after about every 200 deposition cycles, after about every 300 deposition cycles, after about every 400 deposition cycles, after about every 500 deposition cycles, after about every 1000 deposition cycles, or any other suitable number of deposition cycles. In some examples, at least 2 consecutive deposition cycles are performed without a plasma treatment process. In an example, at least 5 or 10 deposition cycles are performed without a plasma treatment process. In some embodiments a plasma treatment process may be performed before any deposition has been carried out; that is, before any deposition cycle is performed.

In an example, a plasma treatment process may be performed in the same reaction chamber or reactor as the deposition process 100. In some examples, a plasma treatment process may be performed in a different reaction chamber or reactor than the deposition process 100.

In some embodiments, plasma is formed in a reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of remote plasma, the pathway to the substrate can be optimized to maximize electrically neutral species and minimize ion survival before reaching the substrate.

In some embodiments, the Al and N and/or O containing material can be deposited using a plurality of deposition cycles, and the plasma treatment can be applied at one or more times, including, for example, before deposition, after every deposition cycle, at pre-determined intervals during deposition, or after an Al and N and/or O containing material of desired thickness is deposited.

In an example, a plasma treatment process comprises exposing the substrate to direct plasma. In some embodiments a plasma treatment process comprises exposing the substrate to remote plasma. In an example, a plasma treatment process comprises exposing the substrate to excited species or atomic species created in plasma discharge but does not comprise a substantial amount, if any, of ions. In some examples, the plasma may comprise oxygen. In an example, the plasma may comprise nitrogen. Although referred to as a plasma treatment process, in some embodiments a reactive oxygen species that does not comprise plasma may be used, for example ozone. In some embodiments the plasma may comprise hydrogen.

In an example, utilizing a pretreatment process or plasma treatment process the substrate is exposed to a reactant comprising oxygen plasma. O2 may be provided as a source gas, for example, from about 1 to about 2000 sccm, more preferably from about 5 to about 1000 sccm, and most preferably from about 50 to about 500 sccm. In some examples, O2 may be provide at about 300 sccm.

In an example, utilizing a pretreatment process or plasma treatment process the substrate is exposed to a reactant comprising nitrogen plasma. N2 may be provided as a source gas, for example, at about from about 1 to about 5000 sccm, more preferably from about 5 to about 2000 sccm, and most preferably from about 50 to about 500 sccm. In some embodiments N2 may be provided at about 300 sccm.

In an example, utilizing a pretreatment process or plasma treatment process the substrate is exposed to a reactant comprising hydrogen plasma. In some embodiments, H2 may be provided as a source gas, for example, from about 1 to about 2000 sccm, more preferably from about 5 to about 1000 sccm, and most preferably from about 10 to about 100 sccm. In some examples, H2 may be provided at about 50 sccm. Similar conditions can be used for other types of plasma.

In an example, a plasma treatment process may comprise exposing the substrate to a reactant at a treatment temperature. In some embodiments the treatment temperature may be greater than about 20° C. In an example, a treatment temperature may be between about 20° C. and about 500° C., more preferably between about 50° C. and about 450° C., more preferably between about 150° C. and about 400° C. In some examples, the treatment temperature may be about the same as the deposition temperature and/or the pretreatment temperature. In an example, the treatment temperature may be different than the deposition temperature and/or pretreatment temperature.

In some embodiments plasma may be generated at a power of less than about 2500 Watts, for example about 1 to about 1000 Watts, about 1 to about 500 W, or about 1 to about 200 W or less. In an example, plasma may be generated at a power of 50 W. In some examples, plasma may be generated at a power of 100 W.

In an example, the plasma is provided for less than about 200 seconds, for example about 180 seconds or less, about 60 seconds or less, about 30 seconds or less, about 10 seconds or less, or about 3 seconds or less.

In some embodiments a plasma treatment process 170 may be substantially identical to a pretreatment process 110.

Although the illustrated Al and N and/or O containing material deposition cycle begins with contacting the surface of the substrate with the first vapor phase precursor comprising Al, in other embodiments the deposition cycle begins with contacting the surface of the substrate with the second vapor phase precursor comprising nitrogen. It will be understood by the skilled artisan that contacting the substrate surface with the first vapor phase precursor comprising Al and second vapor phase precursor comprising nitrogen are interchangeable in the deposition cycle.

In an example, the substrate is moved such that different reactants alternately and sequentially contact the surface of the substrate in a desired sequence for a desired time. In some examples, the removing steps, 130 and 150 are not performed. In an example, no reactant may be removed from the various parts of a chamber. In some embodiments the substrate is moved from a part of the chamber containing a first precursor to another part of the chamber containing the second reactant. In an example, the substrate is moved from a first reaction chamber to a second, different reaction chamber.

The skilled artisan can determine the optimal reactant evaporation temperatures based on the properties of the selected precursors. The skilled artisan can determine the optimal reactant contact times through routine experimentation based on the properties of the selected precursors and the desired properties of the deposited Al and N and/or O containing material.

The growth rate of the Al and N and/or O containing materials will vary depending on the reaction conditions. In some examples, the deposited Al and N and/or O containing material comprises a thin film. In an example, the deposited Al and N and/or O containing material comprises AlN and Al2O3

In some embodiments the deposited Al and N and/or O containing material is AlN. In an example, the deposited Al and N and/or O containing material is Al2O3. In an example, the deposited Al and N and/or O containing material is non-stoichiometric AlxOy. In some examples, Al and N and/or O containing materials are formed that consist essentially of Al and N and/or O. In some embodiments, additional reactants may be used to incorporate into or contribute other materials to the film, for example oxygen to form aluminum oxynitrides. In an example, where additional non-metal elements in addition to nitrogen are desired, an ALD process for forming the Al and N and/or O containing material may comprise phases in addition to the initial Al and N and/or O phases. For example, they may include an oxidation phase where metal aluminum oxynitrides are desired. In an oxidation phase, oxygen or an oxygen-containing precursor is provided in the reaction chamber and allowed to contact the substrate surface. The oxygen phase may be part of one or more deposition cycles. In some embodiments a second metal phase may be provided in one or more deposition cycles. The oxidation phase, or other desirable phase, may follow the Al phase or the N phase, but in either situation, it is desirable in some embodiments, to remove excess oxygen (or other reactant) and any reaction by-products from the reaction space before proceeding to the next phase. In an example, an additional phase, such as an oxygen, or additional metal phase may be provided after the final deposition cycle, or intermittently in the deposition process.

In an example, deposition of an Al and N and/or O containing material on a first surface of a substrate relative to a second surface of the substrate is at least about 90% selective, at least about 95% selective, at least about 96%, 97%, 98% or 99% or greater selective. In some examples, deposition of an Al and N and/or O containing material only occurs on the first surface and does not occur on the second surface. In an example, deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular applications. In an example, the deposition on the first surface of the substrate relative to the second surface of the substrate is at least about 1%, at least about 2.5%, at least about 5%, at least about 10%, at least about 15%, at least about 20%, at least about 25%, at least about 30%, or at least about 40%, all of which may be selective enough for some particular applications.

In some examples, the ratio of Al and N and/or O containing material deposited on a first surface of a substrate relative to a second surface of the substrate may be greater than or equal to about 10:1, greater than or equal to about 20:1, or greater than or equal to about 40:1. In an example, the ratio of Al and N and/or O containing material deposited on a first surface of a substrate relative to a second surface of the substrate may be greater than or equal to about 10:1, greater than or equal to about 20:1, or greater than or equal to about 40:1 when the thickness of Al and N and/or O containing material deposited on the first surface is more than about 5 nm. In some embodiments the ratio of Al and N and/or O containing material deposited on a first surface of a substrate relative to a second surface of the substrate may be greater than or equal to about 10:1, greater than or equal to about 20:1, or greater than or equal to about 40:1 when the thickness of Al and N and/or O containing material deposited on the first surface is more than about 2.5 nm. In an example, the ratio of Al and N and/or O containing material deposited on a first surface of a substrate relative to a second surface of the substrate may be greater than or equal to about 10:1, greater than or equal to about 20:1, or greater than or equal to about 40:1 when the thickness of Al and N and/or O containing material deposited on the first surface is more than about 1 nm.

In some examples, the ratio of Al and N and/or O containing material deposited on a first surface of a substrate relative to a second surface of the substrate may be greater than or equal to about 10:1, greater than or equal to about 20:1, or greater than or equal to about 40:1 when the Al and N and/or O containing material deposition process comprises between about 0 and about 25 deposition cycles, between about 0 and about 50 deposition cycles, between about 0 and about 100 deposition cycles, or between about 0 and about 150 deposition cycles, between about 0 and about 300 deposition cycles, between about 0 and about 500 deposition cycles, between about 0 and about 700 deposition cycles, or between about 0 and about 1000 deposition cycles. In an example, less than about 0.1 nm of Al and N and/or O containing material is deposited on the second surface of the substrate when an Al and N and/or O containing material deposition process comprises between about between about 0 and about 25 deposition cycles, between about 0 and about 50 deposition cycles, between about 0 and about 100 deposition cycles, or between about 0 and about 150 deposition cycles, between about 0 and about 300 deposition cycles, between about 0 and about 500 deposition cycles, between about 0 and about 700 deposition cycles, or between about 0 and about 1000 deposition cycles.

In some embodiments an Al and N and/or O containing material has etch selectivity relative to SiO2, that is an Al and N and/or O containing material has an etch rate less than an etch rate of SiO2, for example in dilute HF. In an example, an Al and N and/or O containing material has a wet etch rate (WER) of less than ⅕ the thermal oxide removal rate of about 2-3 nm per minute with diluted HF (0.5%). In some examples, the wet etch rate of the Al and N and/or O containing material relative to the wet etch rate of thermally oxidized silicon ($SiO_2$, TOX) is less than about 0.2 in 0.5% dHF. In an example, the wet etch rate of the Al and N and/or O containing material relative to the wet etch rate of TOX is less than about 0.1 in 0.5% dHF. In some embodiments the wet etch rate of the Al and N and/or O containing material relative to the wet etch rate of TOX is less than about 0.05 in 0.5% dHF.

Figure 2:
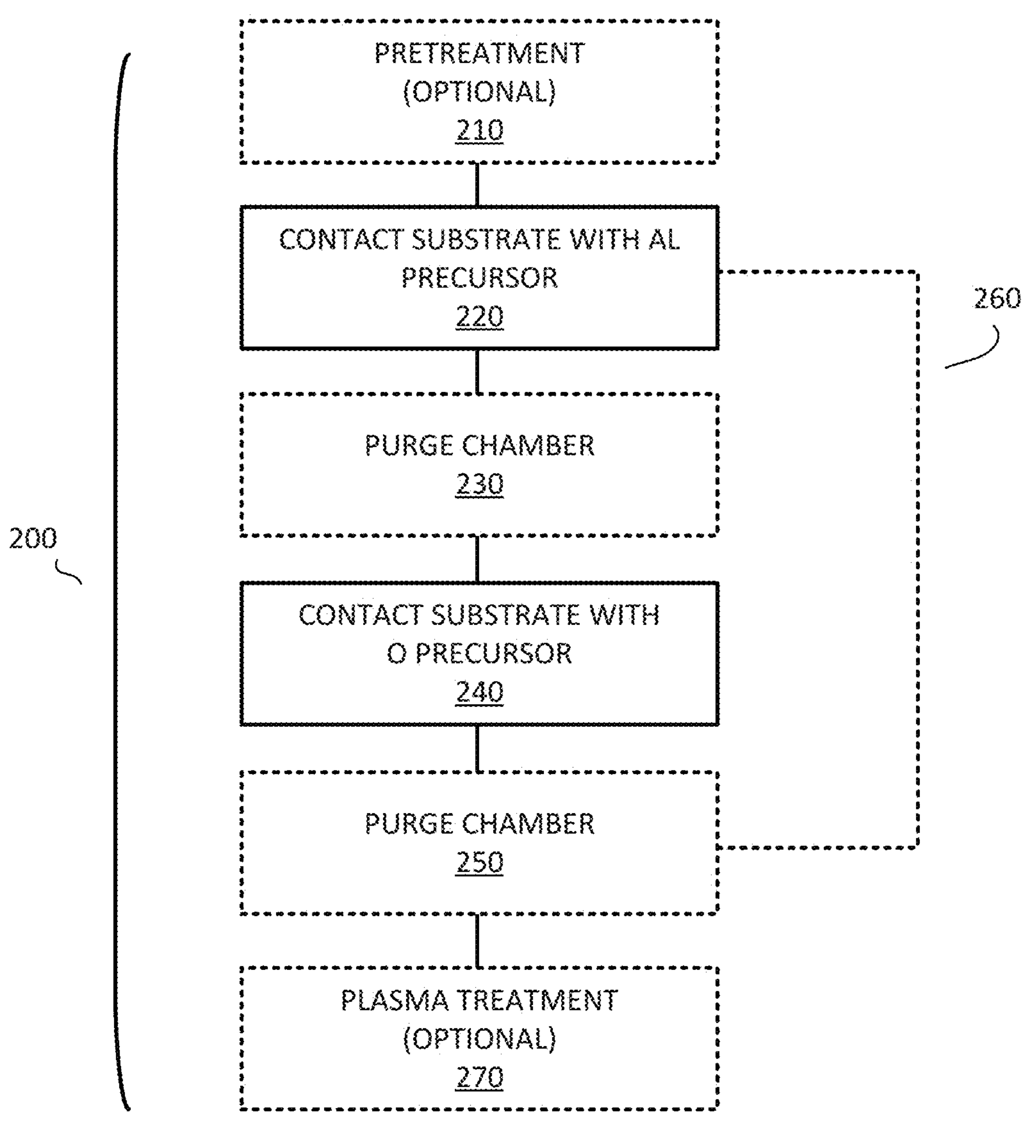
FIG. 2 illustrates a deposition process flow for selectively depositing Al and N and/or O on a first surface of a substrate relative to a second, different surface of the same substrate.

Referring now to FIG. 2, in some embodiments a substrate comprising a first surface and a second surface is provided and AlO is selectively deposited on the first surface of the substrate by a cyclical deposition process 200 comprising at least one cycle comprising: contacting the substrate with a precursor containing Al at step 220; removing excess precursor and reaction by products, if any, from the surface at step 230; contacting the substrate with a vapor phase precursor containing oxygen at step 240; removing from the surface excess oxygen species and any by-products at step 250, and; optionally repeating at step 260 the contacting and removing steps until an aluminum oxide thin film of the desired thickness has been formed.

Although the illustrated aluminum oxide deposition cycle begins with contacting the substrate with TMA, in other embodiments the deposition cycle begins with contacting the substrate with vapor phase oxygen species.

In an example, one or more surfaces of the substrate may be subjected to a pretreatment process prior to beginning the deposition process. In FIG. 2 this is indicated by step 210 in which the substrate can be exposed to a pretreatment reactant, for example a plasma, prior to deposition of the Al and O containing material. In some examples, this pretreatment process may be substantially the same as the pretreatment process 110 described above with respect to FIG. 1.

Referring still to FIG. 2, the substrate is contacted with a first precursor comprising Al at step 220. In an example, the first precursor is conducted into a reaction chamber in the form of vapor phase pulse and contacted with the surface of the substrate. Conditions are preferably selected such that no more than about one monolayer of the precursor is adsorbed on the substrate surface in a self-limiting manner. However, in some embodiments conditions may be selected such that more than one monolayer of the precursor may be formed.

The first precursor pulse is preferably supplied in gaseous form. The first precursor gas is considered “volatile” for purposes of the present description if the species exhibits sufficient vapor pressure under the process conditions to transport the species to the workpiece in sufficient concentration to saturate exposed surfaces.

In some embodiments the first precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second.

The first precursor employed in the ALD type processes may be solid, liquid, or gaseous material under standard conditions (room temperature and atmospheric pressure), provided that the first precursor is in vapor phase before it is conducted into the reaction chamber and contacted with the substrate surface.

At step 230 excess first precursor and reaction byproducts, if any, are removed from the substrate surface, for example by purging with a pulse of inert gas such as nitrogen or argon. Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10 seconds, and still more preferably between about 1 and 2 seconds. However, other purge times can be utilized if necessary, such as when depositing layers over extremely high aspect ratio structures or other structures with complex surface morphology is needed. The appropriate purging times can be readily determined by the skilled artisan based on the particular circumstances.

In other embodiments however, removing excess first precursor and reaction byproducts, if any, may comprise moving the substrate so that the first precursor no longer contacts the substrate. In an example, no precursor may be removed from the various parts of a chamber. In some examples, the substrate is moved from a part of the chamber containing a first precursor to another part of the chamber containing a second precursor or no precursor at all. In an example, the substrate is moved from a first reaction chamber to a second, different reaction chamber.

At step 240 the substrate is contacted with a second vapor phase precursor comprising oxygen (O). In some embodiments the second precursor is pulsed into the chamber where it reacts with the first precursor bound to the first surface of the substrate. The reaction typically forms up to about a monolayer of an Al and O containing material on the substrate. In some embodiments, however, more than one molecular layer of an Al and O containing material is formed on the substrate.

In some embodiments, the second precursor may include a plasma or radicals. While one skilled in the art will recognize that any number of suitable second precursors may be used, appropriate second precursors include oxygen containing compounds that favorably react with the ligands of a previously or subsequently deposited first precursor. Accordingly, selection of an appropriate second precursor may depend on the specific first precursor used and the nature of the ligands in the first precursor In an example, the second precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second. However, depending on the reactor type, substrate type and its surface area, the second precursor contacting time may be even higher than 10 seconds. In some embodiments, contacting times can be on the order of minutes. The optimum contacting time can be readily determined by the skilled artisan based on the particular circumstances.

The concentration of the second precursor in the reaction chamber may be from about 0.01% by volume to about 99.0% by volume. And the second precursor may flow through the reaction chamber at a rate of between about 1 standard cm3/min and about 4000 standard cm3/min.

At step 250, excess second precursor and gaseous by-products of the surface reaction, if any, are removed from the substrate, as described above for step 130. In some examples, excess precursor and reaction byproducts are preferably removed with the aid of an inert gas.

The steps of contacting and removing may be optionally repeated at step 260 until an Al and O containing material of a desired thickness has been formed on the first surface of the substrate, with each cycle leaving no more than about a molecular monolayer. In some cases, it might be desirable to achieve at least partial decomposition of at least one the various precursors. Thus, in some embodiments conditions may be selected such that more than one molecular layer of an Al and O containing material is formed on the substrate in each deposition cycle.

The Al and O containing material ALD processes of the present disclosure may comprise one or more cycles. Some embodiments involve the repetition of at least about 5 cycles, at least about 10 cycles, or at least about 50 cycles, or at least about 100 cycles, at least about 150 cycles, or at least about 200 cycles, or at least about 350 cycles, at least about 500 cycles, or at least about 650 cycles, or at least about 800 cycles, at least about 950 cycles, or at least about 1000 cycles. In some embodiments, no more than 1000 cycles are performed to form a thin film of a desirable thickness.

In an example, the substrate surface and/or Al and O containing material may optionally be subjected to a plasma treatment process.

In some embodiments a pretreatment process may enhance the selectivity of the selective deposition process 200. In an example, a pretreatment process may enhance the selectivity of a subsequent selective deposition process by a factor of more than about 2, more than about 5, or more than about 10. In some examples, a pretreatment process may enhance deposition of AlO on one surface relative to one or more different surfaces prior to beginning the deposition process. In an example, a pretreatment process may inhibit the deposition of AlO on one surface relative to one or more different surface prior to beginning the deposition process. In some embodiments a pretreatment process may inhibit deposition of an Al and O containing material on one surface relative to one or more different surface prior to beginning the deposition process 200.

In an example, the substrate surface and/or aluminum oxide thin film may optionally be subjected to a plasma treatment process. In some examples, a pretreatment process may be performed in the same reaction chamber or reactor as the subsequent deposition process 100. In an example, a pretreatment process may be performed in a different reaction chamber or reactor than the subsequent deposition process 100.

In FIG. 2 this is indicated by step 270. In some embodiments this plasma treatment process may be substantially the same as the plasma treatment process 170 described above with respect to FIG. 1.

In an example, the plasma treatment process 270 may be substantially identical to the pretreatment step 210. In some examples, the plasma treatment process may be performed after more than one deposition cycle has been performed. In an example, a plasma treatment process may be performed before the deposited aluminum oxide film is continuous or closed. In some embodiments a plasma treatment process may be performed after more than about 10 deposition cycles, after more than about 20 deposition cycles, or after more than about 50 deposition cycles. In an example, a plasma treatment process may be performed in the same reaction chamber or reactor as the deposition process 200. In some examples, a plasma treatment process may be performed in a different reaction chamber or reactor than the deposition process 200.

In an example, a substrate comprising a first surface and a second dielectric surface is provided and an Al and O containing material is selectively deposited on the first surface of the substrate by a cyclical deposition process comprising at least one cycle comprising alternately and sequentially contacting the substrate with a vapor phase first precursor and a vapor phase second precursor. In some embodiments the first precursor may comprise Al and the second precursor may comprise 0. In an example, the first precursor may comprise TMA and the second precursor may comprise H2O.

In some examples, a substrate comprising a first surface and a second dielectric surface is provided and Al2O3 is selectively deposited on the first surface of the substrate by a cyclical deposition process comprising at least one cycle comprising alternately and sequentially contacting the substrate with a vapor phase first precursor and a vapor phase second precursor. In an example, the first precursor may comprise Al and the second precursor may comprise 0.

In some embodiments the first precursor may comprise TMA and the second precursor may comprise H2O.

In an example, a substrate is provided and aluminum oxide is deposited on at least part of the substrate by a cyclical deposition process comprising at least one cycle comprising alternately and sequentially contacting the substrate with a vapor phase first precursor and a vapor phase second precursor and the first precursor may comprise an aluminum containing precursor (e.g., TMA) and the second precursor may comprise an oxygen reactant (e.g., H2O, O3, H2O2, or the like).

In some embodiments, prior to deposition the substrate may be subjected to a pretreatment process. In some examples, a pretreatment process may enhance the selectivity of the selective deposition process. In an example, a pretreatment process may enhance deposition of aluminum oxide on one surface relative to one or more different surfaces prior to beginning the deposition process. In some embodiments a pretreatment process may inhibit deposition of aluminum oxide on one surface relative to one or more different surface prior to beginning the deposition process. In an example, a pretreatment process may comprise exposing the substrate to a pretreatment reactant, for example plasma, prior to deposition of aluminum oxide.

In some examples, the substrate surface and/or aluminum oxide thin film may optionally be subjected to a plasma treatment process. In an example, this plasma treatment process may be substantially the same as the plasma treatment processes 170 and 270 described above with respect to FIG. 1 and FIG. 2.

In some embodiments the plasma treatment process may be substantially identical to the pretreatment process. In an example, the plasma treatment process may be performed after more than one deposition cycle has been performed. In some examples, a plasma treatment process may be performed before the deposited aluminum oxide film is continuous or closed. In an example, a plasma treatment process may be performed after less than about 10 deposition cycles, after less than about 20 deposition cycles, or after less than about 50 deposition cycles. In some embodiments a plasma treatment process may be performed in the same reaction chamber or reactor as the deposition process. In an example, a plasma treatment process may be performed in a different reaction chamber or reactor than the deposition process.

Referring to FIG. 3A and according to some embodiments, an Al and N and/or O containing material is selectively formed on a first surface relative to a second different surface of a substrate, the substrate comprising the first surface and the second, different surface by a process 300 comprising at least one super-cycle 301 comprising, selectively depositing the Al and N and/or O containing material on the first surface of the substrate relative to the second, different surface at step 320, etching the deposited Al and N and/or O containing material such that substantially all of the deposited Al and N and/or O containing material is removed from the second surface and not all of the deposited Al and N and/or O containing material is removed from the first surface at step 330, optionally repeating at step 340 the selectively depositing and etching steps until an Al and N and/or O containing material of the desired thickness has been formed on the first surface of the substrate relative to the second different surface.

In some examples, one or more surfaces of the substrate may be subjected to a pretreatment process at step 310 (see FIG. 3B) at the beginning of the super-cycle 301. In an example, a pretreatment process may enhance the selectivity of the selective deposition process step 320. In some embodiments a pretreatment process may enhance deposition of an Al and N and/or O containing material on one surface relative to one or more different surfaces prior to a selective deposition step 320. In an example, a pretreatment process may inhibit deposition of an Al and N and/or O containing material on one surface relative to one or more different surfaces prior to a selective deposition step 320.

In an example, the Al and N and/or O containing material may be deposited according to methods described with respect to FIG. 1 and/or FIG. 2. In an example, the selective deposition of the Al and N and/or O containing material may begin with methods described with respect to FIG. 1 and/or FIG. 2, wherein the deposited Al and N and/or O containing material may subsequently be modified as described below for example by oxidation in step 350 and/or by exposure to one or more cyclic deposition-etch-oxidation steps (e.g., in step 320, step 330 and 350, respectively), and/or by exposure to a pretreatment (e.g., in step 310).

In FIG. 3A this is indicated by step 310 of super-cycle 301, in which the substrate can be exposed to a pretreatment reactant, for example a plasma, prior to the selective deposition of an Al and N and/or O containing material at step 320.

In some examples, a pretreatment process may be the same as pretreatment processes 110 and/or 210 as described herein with respect to FIGS. 1 and 2. In an example, a pretreatment process may comprise exposing the substrate to a pretreatment reactant. In some embodiments a pretreatment reactant may comprise hydrogen. In an example, the pretreatment reactant comprises hydrogen radicals, atomic hydrogen, hydrogen plasma, or combinations thereof. In some examples, the pretreatment reactant may comprise a plasma generated from a gas comprising H2.

In some embodiments, plasma is formed in a reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of remote plasma, the pathway to the substrate can be optimized to maximize electrically neutral species and minimize ion survival before reaching the substrate.

In an example, the treated substrate is not exposed to the ambient environment after a pretreatment process 310 and before beginning a selective deposition step 320. In some embodiments the treated substrate is not exposed to air after a pretreatment process 310 and before beginning a selective deposition process at step 320.

In an example, a pretreatment process may be used to enhance the selectivity of the subsequent selective deposition process. In some examples, a pretreatment process may enhance selective deposition of an Al and N and/or O containing material on a first surface relative to a second different surface, for example a first and second surface as described herein. In an example, a pretreatment process may enhance the selectivity of a subsequent selective deposition process by a factor of more than about 2, more than about 5, or more than about 10.

In some embodiments a pretreatment process 310 may be performed in the same reaction chamber or reactor as the subsequent selective deposition step 320. In an example, a pretreatment process 310 may be performed in a different reaction chamber or reactor than the subsequent selective deposition step 320.

Referring again to FIG. 3A, Al and N and/or O containing material is selectively deposited on the first surface of the substrate relative to the second surface at step 320. In some examples, selectively depositing the Al and N and/or O containing material at step 320 may comprise a selective deposition process comprising one or more deposition sub-cycles comprising alternately and sequentially contacting the substrate with a first vapor phase aluminum precursor and one or more other vapor phase precursors containing N and/or O. In an example, the deposition sub-cycle may be repeated between 1 and 1000 times, between 1 and 500 times, between 1 and 300 times, between 1 and 200 times, between 1 and 50 times, between 1 and 30 times, or between 1 and 10 times.

In some embodiments selectively depositing the Al and N and/or O containing material at step 320 may comprise one or more deposition sub-cycles. Some embodiments involve the repetition of at least about 5 sub-cycles, at least about 10 sub-cycles, at least about 50 sub-cycles, at least about 100 sub-cycles, at least about 150 sub-cycles, at least about 200 sub-cycles, at least about 300 sub-cycles, at least about 500 sub-cycles, or at least about 1000 sub-cycles. In an example, a selective deposition sub-cycle may be repeated until the selective deposition sub-cycle is no longer selective. In some examples, a selective deposition sub-cycle may be repeated until the selective deposition sub-cycle is no longer significantly selective. In an example, a selective deposition sub-cycle may be repeated until the selective deposition sub-cycle has lost a significant amount of selectivity. In some embodiments a selective deposition sub-cycle may be repeated until the selective deposition sub-cycle no longer achieves a desired level of selectivity, for example until the selective deposition sub-cycle no longer achieves about 50% selectivity, about 40% selectivity, about 30% selectivity, about 20% selectivity, about 10% selectivity, about 5% selectivity, about 2% selectivity, about 1% selectivity or less.

That is, in some embodiments selectively depositing the Al and N and/or O containing material at step 320 may comprise repeating a selective deposition sub-cycle, for example an ALD deposition cycle as described herein until said sub-cycle no longer selectively deposited Al and N and/or O containing material on the first surface of the substrate relative to the second surface. In some examples, selectively depositing the Al and N and/or O containing material at step 320 may comprise repeating a selective deposition sub-cycle, for example an ALD deposition cycle as described herein until the selectivity of said sub-cycle drops below a predetermined selectivity. For example, in some embodiments selectively depositing the Al and N and/or O containing material at step 320 may comprise repeating a selective deposition sub-cycle until said selective deposition sub-cycle has a selectivity less than about 50%, less than about 25%, less than about 15%, less than about 10%, less than about 5%, less than about 2%, less that about 1%, or lower.

Subsequent to selectively depositing the Al and N and/or O containing material at step 320, the deposited Al and N and/or O containing material is etched, for example by subjecting the Al and N and/or O containing material to a vapor etch process at step 330. In an example, the etch process removes substantially all of any deposited Al and N and/or O containing material from the second surface of the substrate and does not remove substantially all of the deposited Al and N and/or O containing material from the first surface of the substrate. In some embodiments the etch process may remove the same, or a similar amount or thickness of Al and N and/or O containing material from the first and second surfaces of the substrate, but because Al and N and/or O containing material has been selectively deposited on the first surface relative to the second surface at step 320, at least some thickness of Al and N and/or O containing material remains on the first surface of the substrate while substantially all or all of any Al and N and/or O containing material that has been deposited on the second surface of the substrate is removed by the etch process at step 330.

Referring now to FIG. 3C, in some embodiments etching the deposited Al and N and/or O containing material at step 330 may comprise subjecting the deposited Al and N and/or O containing material to a vapor etch process. In some embodiments, the vapor etch process may be a cyclical vapor etch process (step 336).

In some embodiments, the vapor etch process may comprise an atomic layer etch (ALE) process.

In an example, the etch process of step 330 may comprise an ALE process comprising one or more etching sub-cycles comprising: contacting the substrate with a first vapor phase etch reactant (e.g., step 332); removing excess first etch reactant and reaction byproducts, if any, from the substrate (e.g., step 333); contacting the substrate with a second vapor phase etch reactant (e.g., step 334); removing excess second etch reactant and reaction byproducts, if any, from the substrate (e.g., step 333); and optionally repeating the contacting and removing step to etch the deposited Al and N and/or O containing material to a desired extent, for example until the deposited Al and N and/or O containing material is substantially completely removed from the second surface of the substrate.

In some examples, the etch process of step 330 may comprise an ALE process comprising one or more etching sub-cycles comprising: contacting the substrate with a first vapor phase halide etch reactant, for example HF, CCl4, BCl3, CF4, hacac, NF3, hexafluoroacetylacetone (hhfac), and/or trifluroacetylacetonate (e.g., step 332); removing excess first etch reactant and reaction byproducts, if any, from the substrate (e.g., step 333); contacting the substrate with a second vapor phase etch reactant comprising Al, for example (e.g., step 334); removing excess second etch reactant and reaction byproducts, if any, from the substrate (e.g., step 333); and optionally repeating the contacting and removing step to etch the deposited Al and N and/or O containing material to a desired extent, for example until the deposited Al and N and/or O containing material is substantially completely removed from the second surface of the substrate.

In an example, a sub-monolayer or more of material can be removed from a substrate by atomic layer etching (ALE) processes comprising contacting the substrate surface in a reaction space with at least one vapor-phase reactant. In some embodiments one or more vapor-phase halide reactants are used. The halide reactants may be metal halides, non-metal halides, semi-metal halides, semi/non-metal oxyhalides, organic halide and/or organic (oxy)halides. For example, the vapor-phase halide reactant may comprise any of CCl4, NF3, hexafluoroacetylacetone, and/or trifluroacetylacetonate.

In an example, surface contamination may be removed from a substrate surface, such as B or C contamination.

In some embodiments, ALE processes comprise alternately contacting the substrate surface in a reaction space with at least first and second vapor-phase reactants. In some examples, one or more of the vapor-phase reactants is a halide reactant. One or more etch cycles or sub-cycles may be provided in an ALE process as part of a selective deposition process or selective deposition super-cycle. In an example, the etch cycles comprise alternately exposing the substrate to two different reactants. In some embodiments the etch cycles comprise exposing the substrate to three different reactants. In an example, the etch cycles comprise exposing the substrate to four different reactants. In some examples, the etch cycles comprise exposing the substrate to more than four reactants. In an example, the reactant exposures are sequential. Each reactant exposure may be separated by a purge of the reaction space, or by pumping down the reaction chamber to remove reaction by products and excess reactant.

In some embodiments the substrate to be etched is exposed to one or more reactants selected from halides, oxygen compounds, oxygen scavengers, halide exchange drivers, ligand exchangers and metal organic or inorganic reactants. Oxygen compounds may comprise, for example, H2O, O2 or O3. Oxygen scavengers or halide exchange drivers may comprise, for example, ChyClx, CCl4. In an example, an oxygen scavenger or halide exchange driver is a halide as described herein, including a non-metal or semi-metal halide. The halide exchange driver may be NF3, hexafluoroacetylacetone, WF6, and/or trifluroacetylacetonate.

In some examples, ligand exchangers or metal or inorganic reactants may comprise, for example, TMA, Hacac or TMA/Sn(acac)2. In an example, a ligand exchanger may be a halide as described herein, including a non-metal or semi-metal halide.

In some embodiments the etch cycles (step 336) may comprise a saturative, self-limiting adsorption step in which the substrate is contacted with at least one vapor phase reactant, such as a halide reactant. For example, the substrate may be contacted with a first vapor-phase reactant (step 332) followed by a second exposure step in which the substrate is contacted with a second vapor-phase reactant (step 334). In the first adsorption step the first reactant adsorbs in a self-limiting manner to the material to be etched on the substrate surface. The second exposure step then leads to the formation of volatile by-products that contain the adsorbate atoms, the second precursor atoms and some atoms from the surface being etched. In this way the etching of the desired material on the substrate surface can be carefully controlled.

In an example, the reactions are not self-limiting. However, controlled etching may be achieved by supplying a controlled dose of one or more of the reactants.

In some embodiments, gas phase reactions are avoided by feeding the precursors alternatively and sequentially into the reaction chamber. Vapor phase reactants are separated from each other in the reaction chamber, for example, by removing excess reactants and/or reaction by-products from the reaction chamber between reactant pulses (step 333). The reactants may be removed from proximity with the substrate surface with the aid of a purge gas and/or vacuum. In some examples, excess reactants and/or reactant byproducts are removed from the reaction space by purging, for example with an inert gas. Because of the separation of reactants and the self-limiting nature of the reactions, less than a monolayer of material is typically removed in each ALE etch cycle. However, in some embodiments more than one monolayer may be removed in each cycle. In an example, pulses of reactants may partially or completely overlap. For example, in some embodiments one reactant may flow continuously into the reaction space while one or more additional reactants are provided intermittently, at desired intervals.

In some embodiments the ALE methods disclosed herein are thermal etching processes, as opposed to plasma etching processes. Thus, plasma reactants are not used in these thermal ALE etch cycles. While referred to as 'thermal' ALE processes to differentiate processes that use plasma reactants, in some embodiments the ALE reactions may have zero activation energy and therefore may not require any additional thermal energy. Thus the reactions may also be referred to as chemical etching processes. Thermal ALE methods can be more desirable in some situations than plasma ALE methods because thermal ALE methods can be less damaging to the underlying substrate. Also, thermal ALE methods can allow for isotropic etching of non-line of sight (NLOS) features.

However, in some embodiments the etch process may comprise an ALE process that does include plasma. In an example, an ALE process may comprise contacting the deposited Al and N and/or O containing material with at least one vapor phase etch reactant. In some examples, the etch process may be a dry etch process, for example a reactive-ion etching process. In an example, the dry etch process may be a thermal dry etch process. In some embodiments the dry etch process may include the use of plasma.

In an example, the etch process of step 330 may comprise an ALE process comprising one or more etching sub-cycles comprising alternately and sequentially contacting the deposited Al and N and/or O containing material with a first vapor phase etch reactant (at step 332) and a second vapor phase etch reactant (at step 334). In some examples, the etching sub-cycle may be repeated between 1 and 1000 times, between 1 and 500 times, between 1 and 300 times, between 1 and 200 times, between 1 and 50 times, between 1 and 100 times, or between 1 and 50 times.

In an example, an etch sub-cycle may be repeated one or more times. Some embodiments involve the repetition of at least about 5 sub-cycles, at least about 10 sub-cycles, at least about 50 sub-cycles, at least about 100 sub-cycles, at least about 150 sub-cycles, at least about 200 sub-cycles, at least about 300 sub-cycles, at least about 500 sub-cycles, or at least about 1000 sub-cycles. In some embodiments an etch sub-cycle may be repeated until substantially all of the deposited Al and N and/or O containing material is removed from the second surface of the substrate while not all of the deposited Al and N and/or O containing material is removed from the first surface of the substrate.

According to some embodiments, etch sub-cycles may be performed at temperatures ranging from about 20 to about 1200° C., about 50 to about 800° C., about 75 to about 600° C., about 300° C. to about 500° C., or from about 350° C. to about 450° C. In an example, the temperature is greater than about 20, 50 or 100° C., but less than about 1000, 800, 600 or 500° C. In some examples, the cycles are carried out at a temperature of about between 200° C. and 450° C.

The pressure in the reaction chamber is typically from about 1.0 torr to about 760 torr, or about 0.001 to about 100 torr. However, in some cases the pressure will be higher or lower than this range, as can be determined by the skilled artisan given the particular circumstances. In an example, a pressure of less than 2 ton is utilized.

In some embodiments an etch reactant contacts the substrate with the surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In an example, an etch reactant contacts the substrate surface to be etched for about 0.05 seconds to about 5.0 seconds, about 0.1 seconds to about 3 seconds or about 0.2 seconds to about 1.0 seconds. In some examples, the contacting time may be greater than about 60 seconds. However, depending on the reactor type, material being etched and other process conditions, such as surface area and temperature, an etch reactant contacting time may be even higher than about 10 seconds. In some embodiments, contacting times can be on the order of minutes. The optimum contacting time can be readily determined by the skilled artisan based on the particular circumstances.

In an example, excess etch reactant and reaction byproducts, if any, can be removed from the substrate by, for example, purging the reaction chamber with an inert purge gas. In some embodiments the reaction chamber may be purged by stopping the flow of the etch reactant while continuing to flow a carrier gas or purge gas for a sufficient time to diffuse or purge excess reactants and reactant by-products, from the reaction space. In an example, the excess etch reactant and reaction by-products are purged with the aid of inert gas, such as helium or argon. In some examples, the substrate may be moved from the reaction space containing the second reactant to a different reaction space. The pulse of purge gas may, in some embodiments, be from about 0.1 seconds to about 10 seconds, about 0.1 seconds to about 4 seconds or about 0.1 seconds to about 0.5 seconds.

In an example, the first vapor phase etch reactant may comprise a halide. In some embodiments the first vapor phase etch reactant may comprise HF, CCl4, BCl3, CF4, hacac, NF3, hexafluoroacetylacetone, trifluroacetylacetonate or NbF5. In an example, the first vapor phase etch reactant may not comprise a plasma or an excited reactant. In some examples, the second vapor phase etch reactant may comprise aluminum. In an example, the second vapor phase etch reactant may comprise one of tritertbutylaluminum (TTBA), trimethylaluminum (TMA) or triethylaluminum (TEA). In some embodiments the second vapor phase etch reactant may be the same as a vapor phase precursor of the selectively depositing step 320. In an example, the second vapor phase etch reactant may comprise TMA. In some examples, the second vapor phase etch reactant may not comprise plasma or an excited reactant.

In an example, the etch step 330 is performed in the same reaction space as the selective deposition step 320. However, in some embodiments the etch step 330 may be performed in a different reaction space than a selective deposition step 320. In some embodiments the selectively depositing AlN and/or aluminum oxide and the subjecting the substrate to an etch process steps may optionally be repeated at step 340 until an Al and N and/or O containing material of a desired thickness has been formed on the first surface of the substrate relative to the second surface. That is, the super-cycle 301 may optionally be repeated until Al and N and/or O containing material of a desired thickness has been formed on the first surface of the substrate relative to the second surface. In an example, the substrate is not exposed to ambient atmosphere after an etch step 330 and prior to beginning another super-cycle 301. In some examples, the substrate is not exposed to air after an etch step 330 and prior to beginning another super-cycle 301. In an example, the substrate is exposed to ambient atmosphere after an etch step 330 and prior to beginning another super-cycle 301. In some examples, the substrate is exposed to air after an etch step 330 and prior to beginning another super-cycle 301.

In some embodiments, super-cycle 301 may include pre-treatment step 310 and/or oxidation treatment step 350 and subject matter is not limited in this regard.

First Precursors

A number of different first precursors can be used in the selective deposition processes described herein as first precursors in a selective deposition cycle and/or selective deposition sub-cycle. In an example, the first precursor is an organometallic compound comprising aluminum. In some embodiments the first precursor is an alkylaluminum compound. In an example, the first precursor does not comprise any other metals than aluminum.

In some examples, the first precursor is a compound having the formula R3Al, where R is an alkyl group. Each R can be independently selected from the list of: methyl, ethyl, propyl, isopropyl, n-butyl, isobutyl, and tertbutyl groups. Preferably each R can be independently selected from: methyl, ethyl and tertbutyl groups. In some embodiments, each R can be independently selected from C1-C4 alkyl groups.

In an example, the first precursor comprises Me3Al, Et3Al, or tBu3Al. In some embodiments the first precursor is tritertbutylaluminum (TTBA) As mentioned above, in some embodiments the first precursor is trimethylaluminum (TMA).

In an example, the first precursor is not a halide. In some examples, the first precursor may comprise a halogen in at least one ligand, but not in all ligands. In an example, the first precursor comprises one chlorine ligand and two alkyl ligands. In some embodiments the first precursor is AlCl3.

In an example, the first precursor may comprise hydrogen as at least one ligand, but not all ligands. In some examples, the first precursor may comprise at least one hydrogen ligand and at least one alkyl ligand.

In an example, the first precursor does not comprise nitrogen. In some embodiments the first precursor does not comprise silicon. In an example, the first precursor does not comprise oxygen. In some examples, the first precursor does not comprise nitrogen, silicon, or oxygen.

Second Precursors

In an example, the second precursor comprises a nitrogen-hydrogen bond. In some embodiments the second precursor is ammonia (NH3). In some embodiments, the second precursor is molecular nitrogen. In an example, the second precursor is a nitrogen containing plasma such as nitrogen and hydrogen containing plasma. In some embodiments, the second precursor comprises an activated or excited nitrogen species. In some examples, the second precursor may be provided in a nitrogen-containing gas pulse that can be a mixture of nitrogen reactant and inactive gas, such as argon.

FIG. 4 illustrates a process flow for a self-aligned contact process including an Al and N and/or O containing material protective layer, capping layer, or etch stop layer, according to some embodiments. In an example, a process for forming of a self-aligned contact 400 proceeds as follows: a semiconductor substrate comprising a first surface 412 and a second (different) surface 414 is provided at step 401; an Al and N and/or O containing protective layer 416 or etch stop layer, for example AlN, aluminum oxide or a combination thereof is selectively deposited on the first surface of the substrate relative to the second surface 414, at step 402; and the protective layer 416 on the second surface 414 is removed, for example using an etch process (e.g., step, 330), at step 403.

The semiconductor substrate comprises a first surface 412 and a second, different surface 414. In some embodiments the first surface 412 comprises a conductive surface. In an example, the first surface 412 comprises one or more metal nitrides. In some examples, the first surface 412 may comprise the surface of a conductive gate and/or the surface of a spacer. For example, in some embodiments the first surface 412 may comprise a TiN gate and a SiN spacer. As a non-limiting example, the first surface 412 may comprise any of the following materials in a non-limiting example, W, Co, Ru, TiN, Cu, Mo, MoN, TaN, and/or Ta. The second surface 414 is preferably a dielectric surface. In an example, the dielectric comprises SiO2. In some embodiments the second surface 414 is a dummy contact overlying a source/drain region. In an example, the SiO2 dummy contact directly overlies a source/drain region. As a non-limiting example, the second surface 414 may comprise any of the following materials in a non-limiting example, SiO2, SiN, SiGe, SiOxC, SiOxN, HfOx, ZrOx, HfSiOx, SiOxCyNz or ZrSiOx, or a combination thereof, wherein x=0-2, y=0-2 and z=0-2.

In some examples, the semiconductor substrate is subjected to a standard process through gate polish. That is, a semiconductor substrate may be subjected to a standard replaced metal gate process flow to form a source, gate, and drain as is well known in the art. In an example, a semiconductor substrate may be subjected to a chemical-mechanical planarization process. An Al and N and/or O containing protective layer or etch stop layer is selectively deposited on the first surface of the substrate relative to the second surface at step 402. In some embodiments the Al and N and/or O containing protective material is formed according to methods disclosed herein above. At step 403 the second surface of the substrate is removed according to methods disclosed herein above.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The headings provided herein, if any, are for convenience only and do not necessarily affect the scope or meaning of the devices and methods disclosed herein.

What is claimed is:

1. A process for selectively forming aluminum oxide on a first surface of a substrate relative to a second different surface of the substrate, the process comprising one or more super-cycles comprising sub-cycles:

a) selectively depositing aluminum nitride on the first surface of the substrate relative to the second different surface of the substrate by one or more selective deposition sub-cycles;

b) oxidizing at least a portion of the aluminum nitride by one or more oxidizing sub-cycles;

c) etching the aluminum oxide or aluminum nitride, or a combination thereof, by one or more thermal etching sub-cycles, wherein the etchant is an organic halide; and repeating sub-cycles a), b), or c), or a combination thereof until a desired thickness of an aluminum oxide is formed on the first surface.

2. The process of claim 1, wherein the one or more super-cycles additionally comprise exposing the substrate to a pretreatment reactant.

3. The process of claim 2, wherein the substrate is exposed to a pretreatment reactant prior to the one or more selective deposition sub-cycles.

4. The process of claim 2, wherein the pretreatment reactant comprises plasma.

5. The process of claim 4, wherein the plasma is generated from a gas comprising $H_2$.

6. The process of claim 1, wherein the one or more selective deposition sub-cycles comprise:

contacting the substrate with a first vapor phase precursor comprising aluminum; and contacting the substrate with a second vapor phase precursor comprising nitrogen.

7. The process of claim 6, wherein the first vapor phase precursor comprising aluminum comprises tritertbutylaluminum (TTBA), trimethylaluminum (TMA), or triethylaluminum (TEA).

8. The process of claim 6, wherein the second vapor phase precursor comprising nitrogen comprises $NH_3$.

9. The process of claim 1, wherein the one or more oxidizing sub-cycles comprise:

contacting the substrate with a first vapor phase precursor comprising oxygen.

10. The process of claim 9, wherein the first vapor phase precursor comprising oxygen comprises $O_3$, $H_2O$, $H_2O_2$, $O_2$, oxygen atoms, oxygen plasma, ambient or oxygen radicals, or mixtures thereof.

11. The process of claim 1, wherein the one or more thermal etching sub-cycles comprise:

contacting the substrate with a first vapor phase halide etch reactant; and contacting the substrate with a second vapor phase etch reactant comprising aluminum.

12. The process of claim 11, wherein the first vapor phase halide etch reactant comprises HF, $CCl_4$, $BCl_3$, $CF_4$, hacac, $NF_3$, hexafluoroacetylacetone (hhfac), trifluroacetylacetonate, $NbF_5$, or a combination thereof.

13. The process of claim 11, wherein the second vapor phase etch reactant comprising aluminum comprises trimethylaluminum (TMA) or triethylaluminum (TEA).

14. The process of claim 11, wherein the one or more thermal etching sub-cycles are carried out at a process temperature of about 25° C.-500° C.

15. The process of claim 1, wherein the first surface is a conductive surface and the second different surface is a dielectric surface.

16. The process of claim 1, wherein the first surface comprises W, Co, Ru, TiN, Cu, Mo, MON, TaN, or Ta, or a combination thereof.

17. The process of claim 1, wherein the second surface comprises $SiO_2$, SiGe, $SiO_xC$, $SiO_xN$, $HfO_x$, $ZrO_x$, $HfSiO_x$, $SiO_xC_yN_z$, or $ZrSiO_x$, or a combination thereof, where x=0-2, y=0-2 and z=0-2.

18. The process of claim 1, wherein the one or more selective deposition sub-cycles are repeated from 1 to about 1000 times and the one or more thermal etching sub-cycles are repeated from 1 to about 1000 times.

19. The process of claim 1, wherein the one or more thermal etching sub-cycles comprise contacting the substrate with a first vapor phase halide etch reactant comprising hhfac, and a second vapor phase etch reactant comprising TMA.

* * * * *